(12) United States Patent
Johnson et al.

(10) Patent No.: US 8,213,474 B2
(45) Date of Patent: Jul. 3, 2012

(54) ASYMMETRIC DBR PAIRS COMBINED WITH PERIODIC AND MODULATION DOPING TO MAXIMIZE CONDUCTION AND REFLECTIVITY, AND MINIMIZE ABSORPTION

(75) Inventors: Ralph H. Johnson, Murphy, TX (US); James Guenter, Garland, TX (US)

(73) Assignee: Finisar Corporation, Sunnyvale, CA (US)

( * ) Notice: Subject to any disclaimer, the term of this patent is extended or adjusted under 35 U.S.C. 154(b) by 1208 days.

(21) Appl. No.: 11/963,365

(22) Filed: Dec. 21, 2007

(65) Prior Publication Data

US 2011/0096803 A1   Apr. 28, 2011

(51) Int. Cl.
  *H01S 5/00* (2006.01)
(52) U.S. Cl. ............... 372/45.01; 372/50.1; 372/50.124
(58) Field of Classification Search .............. 372/45.01
  See application file for complete search history.

(56) References Cited

U.S. PATENT DOCUMENTS

| 2003/0123513 A1* | 7/2003 | Villareal et al. | 372/96 |
| 2004/0066820 A1* | 4/2004 | Johnson et al. | 372/45 |
| 2006/0045162 A1* | 3/2006 | Johnson | 372/99 |

* cited by examiner

*Primary Examiner* — Jessica Stultz
*Assistant Examiner* — Xnning Niu
(74) *Attorney, Agent, or Firm* — Maschoff Gilmore & Israelsen

(57) ABSTRACT

An optical device for improving conduction and reflectivity and minimizing absorption. The optical device includes a first mirror comprising a first plurality of mirror periods designed to reflect an optical field at a predetermined wavelength, where the optical field has peaks and nulls. Each of the plurality of mirror periods includes a first layer of having a high carrier mobility, a second layer having lower carrier mobility, and a first compositional ramp between the first and second layers. The thicknesses of the first and second layers for at least a portion of the first plurality of mirror periods are established such that the nulls of the optical field occur within the first layer and not within the compositional ramp. At least the portion of the first layers within the first plurality of mirror periods include elevated doping concentrations at locations of the nulls of the optical field.

24 Claims, 5 Drawing Sheets

ASYMMETRIC DBR PAIRS COMBINED WITH PERIODIC AND MODULATION DOPING TO MAXIMIZE CONDUCTION AND REFLECTIVITY, AND MINIMIZE ABSORPTION

BACKGROUND OF THE INVENTION

1. The Field of the Invention

The invention generally relates to lasers. More specifically, the invention relates to Vertical Cavity Surface Emitting Lasers (VCSELs).

2. Description of the Related Art

Lasers are commonly used in many modern components. One use that has recently become more common is the use of lasers in data networks. Lasers are used in many fiber optic communication systems to transmit digital data on a network. In one exemplary configuration, a laser may be modulated by digital data to produce an optical signal, including periods of light and dark output that represents a binary data stream. In actual practice, the lasers output a high optical output representing binary highs and a lower power optical output representing binary lows. To obtain quick reaction time, the laser is constantly on, but varies from a high optical output to a lower optical output.

Optical networks have various advantages over other types of networks such as copper wire based networks. For example, many existing copper wire networks operate at near maximum possible data transmission rates and at near maximum possible distances for copper wire technology. On the other hand, many existing optical networks exceed, both in data transmission rate and distance, the maximums that are possible for copper wire networks. That is, optical networks are able to reliably transmit data at higher rates over further distances than is possible with copper wire networks.

One type of laser that is used in optical data transmission is a Vertical Cavity Surface Emitting Laser (VCSEL). As its name implies, a VCSEL has a laser cavity that is sandwiched between and defined by two mirror stacks. A VCSEL is typically constructed on a semiconductor wafer such as Gallium Arsenide (GaAs). The VCSEL includes a bottom mirror constructed on the semiconductor wafer. Typically, the bottom mirror includes a number of mirror periods, each period including a high index of refraction layer and a low index of refraction layer. As light passes from a layer of one index of refraction to another, a portion of the light is reflected. By using a sufficient number of alternating layers, a high percentage of light can be reflected by the mirror. Typically, each layer within a mirror has a thickness of one-quarter wavelength of the optical field being produced in order to improve reflectivity.

An active region that includes a number of quantum wells is formed on the bottom mirror. The active region forms a PN junction sandwiched between the bottom mirror and a top mirror, which are of opposite conductivity type (i.e. a p-type mirror and an n-type mirror). Free carriers in the form of holes and electrons are injected into the quantum wells when the PN junction is forward biased by an electrical current. At a sufficiently high bias current the injected carriers form a population inversion in the quantum wells that produces optical gain. Optical gain occurs when photons in the active region cause electrons to transition from the conduction band to the valance band which produces additional photons. When the optical gain is equal to the loss in the two mirrors, laser oscillation occurs. The electrons in the quantum well conduction band are stimulated by photons to recombine with holes in the quantum well valence band. This process results in the stimulated emission of photons, which are coherent with the initiating photons.

The active region may also include an oxide aperture formed using one or more oxide layers formed in the top and/or bottom mirrors near the active region. The oxide aperture serves both to form an optical cavity and to direct the bias current through the central region of the cavity that is formed.

A top mirror is formed on the active region. The top mirror is similar to the bottom mirror in that it generally comprises a number of layers that alternate between a high index of refraction and a lower index of refraction. Generally, the top mirror has fewer mirror periods of alternating high index and low index of refraction layers, to enhance light emission from the top of the VCSEL.

Illustratively, the laser functions when a current is passed through the PN junction to inject free carriers into the active region. Recombination of the injected free carrier electrons from the conduction band quantum wells to the valence band quantum wells results in photons that begin to travel in the laser cavity defined by the mirrors. The mirrors reflect the photons back and forth. When the bias current is sufficient to produce a population inversion between the quantum well states at the wavelength supported by the cavity, optical gain is produced in the quantum wells. When the optical gain is equal to the cavity loss laser oscillation occurs and the laser is said to be at threshold bias and the VCSEL begins to 'lase' as the optically coherent photons are emitted from the top of the VCSEL.

In the design of a VCSEL, efforts are made to increase thermal conductivity, increase electrical conductivity, increase reflectivity, and minimize free carrier absorption. Typically, reflectivity is improved by designing the thickness of each of the mirror layers such that the nulls and peaks of the optical field occur within the compositional ramps between each of the mirror layers. Furthermore, electrical conduction is often improved by heavily doping areas within the VCSEL structure. However, elevated doping levels often comes at the cost of increasing absorption levels which reduces mirror reflectance and transmittance causing high threshold currents. Additionally, designing the thickness of the mirror layers such that the peaks and nulls of the optical field occur within the compositional ramps between the mirror layers can often reduce the conduction benefit that would otherwise be gained from elevated doping levels in the ramps because of the low mobilities in the ramps.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY OF THE INVENTION

The present invention is directed to an optical device having DBR mirrors that maximize conduction and reflectivity while minimizing absorption. The DBR mirrors include asymmetric mirror pairs where the thicknesses of the mirror period layers are established such that the null of the optical wave occurs in the layer with high carrier mobility and occurs outside the composition ramps between the mirror period layers. By offsetting the nulls of the optical field from the low mobility compositional ramps high doping levels can be strategically used in the layers of high carrier mobility at the nulls without increasing absorption. Lateral conduction is thus enhanced by the high doping in the higher mobility layers avoiding increased absorption by placing the high doping at the nulls. This offset can be achieved by making the low mobility layers thinner and the high mobility layers thicker so that the nulls of the optical field are in high mobility material. By limiting this adjustment in thickness there is no significant negative impact on mirror reflectivity.

In one embodiment, an optical device includes an optical cavity that includes an active region and a first DBR mirror. The mirror includes a plurality of mirror periods that reflects e., light) at a design wavelength. The optical field has peaks and nulls, and each of the mirror periods includes a first layer having low carrier mobility, a second layer having higher carrier mobility, and a compositional ramp between the first and second layers. The thicknesses of the first and second layers for at least a portion of the mirror periods are established such that the nulls of the optical field occur within the second layer having higher carrier mobility, and not within the compositional ramp. Furthermore, the second mirror layers have elevated doping concentrations at and near the location of the nulls of the optical field.

Variations on this general approach are also illustrated. For example, in another embodiment, a method of fabricating an optical device is provided. The example method includes forming a plurality of mirror periods designed to reflect an optical field at a predetermined wavelength. The optical field includes peaks and nulls. Forming the plurality of mirror periods further includes forming a first layer having a thickness of less than one quarter wavelength of the optical field. Then, a first compositional ramp is formed on the first layer. In one embodiment, the optical thickness of this ramp combined with the first layer is less than one quarter wavelength. A second layer is formed on the compositional ramp, where the second layer has a different index of refraction than the first layer and also has higher carrier mobility than the first compositional ramp. The second layer's optical thickness is greater than the first layer thickness creating an asymmetry in optical thickness such that the nulls of the optical field occur within the second layer and not within the compositional ramp and is heavily doped at and near the location of the nulls of the optical field. As the null may be near a compositional ramp added doping in the ramp also does not cause severe absorption and improves conduction. In addition, at least a portion of the carriers from this added doping in the compositional ramp by modulation doping are transported to the lower Al composition higher mobility layer near the null further enhancing conduction, and not causing significant absorption.

The benefits of the asymmetric layers described above are most beneficial near the active region where the optical fields are highest. In one embodiment of the invention the DBR has reduced asymmetry away from the active region. The position of the peaks and nulls relative to the first and second layers and the ramps is controlled partially by the relative optical layer thicknesses in a section of DBR, but also by the relative phase of the standing wave incident upon this section of the DBR as affected by the rest of the structure. In any case these effects can be simulated using an optical thin film simulator so the nulls are placed in the second layer, but away from the active region and the asymmetry is reduced, and heavier doping is used throughout the DBR periods.

The optical devices and methods described above may be utilized in VCSEL structures. In other words, a VCSEL may be formed using a first mirror, which may include one of the mirrors described above, an active region disposed on the first mirror and containing quantum wells, and a second mirror disposed on the second side of the active region and containing some or all of the properties described in the first mirror.

These and other advantages and features of the present invention will become more fully apparent from the following description and appended claims as set forth below.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

Embodiments described herein are optimized in one or more areas to maximize conduction and reflectivity, and to minimize absorption. An optical device includes asymmetric DBR pairs, where the thicknesses of the mirror period layers are established such that the peaks and/or nulls of the optical wave occur outside of the compositional ramps between the mirror period layers. By offsetting the peaks and/or nulls of the optical field, high doping levels can be strategically used without negatively increasing absorption or decreasing conduction.

Figure 1:
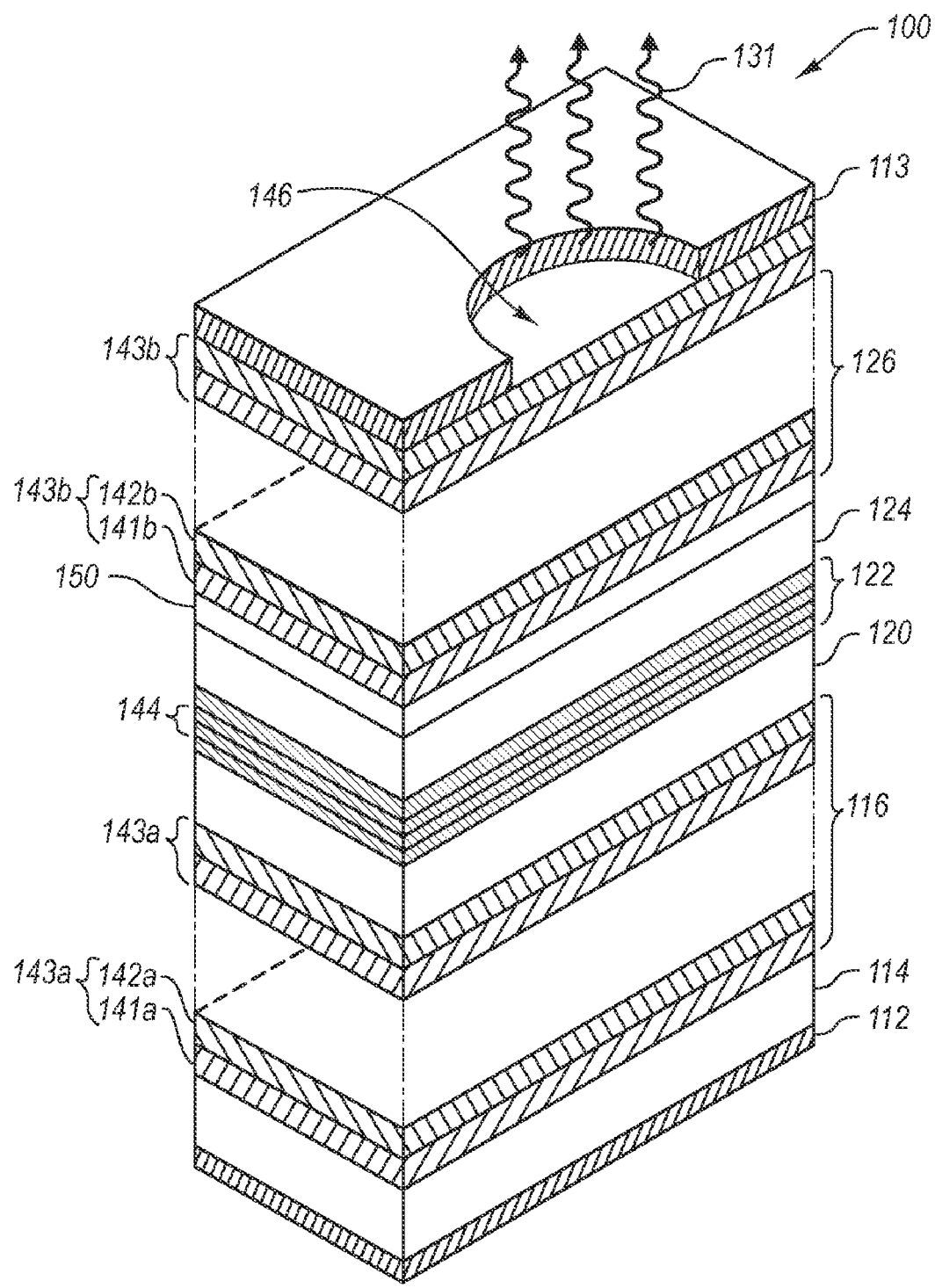
FIG. 1 illustrates on example of a VCSEL according to the present invention.

Embodiments of the invention can be carried out in any optical device that includes DBR mirrors that are made conductive with doping. FIG. 1 shows a planar, current-guided, vertical cavity surface emitting laser (VCSEL) 100 having periodic layer pairs for top and bottom Bragg mirrors. In the illustrated VCSEL 100, a substrate 114 is formed on a bottom contact 112 and is doped with a first type of impurities (i.e. p-type or n-type dopant). In this example, the substrate 114 may be a gallium arsenide (GaAs) substrate. In other embodiments, the substrate 114 may be other material such as other III-V semiconductor materials. A bottom mirror stack 116 is formed on substrate 114 and a bottom confining layer 120 may be formed on bottom stack 116. The bottom confining layer 120 and a top confining layer 124 sandwich an active region 122. An upper mirror stack 126 is formed on the top confining layer 124. A metal layer 113 forms a contact on a portion of mirror stack 126. The VCSEL 100 structure may go through various etching, deposition and oxide growth stages during formation.

Stacks 116 and 126 can be distributed Bragg reflector (DBR) stacks. Each DBR stack 116 and 126 includes alternating layers 141a, 142a, 141b and 142b of high and low refractive index materials. Each alternating layer pair is called a period 143a and 143b. The optical thickness of each alternating layer pair is typically equal to an integral number, typically "1", of half the wavelengths of the laser to be constructed. The top mirror 126 may include about twenty mirror periods where each period includes a high index of refraction layer and a low index of refraction layer.

In the example shown, the bottom mirror 116 may include alternating layers of aluminum arsenide (AlAs) and GaAs, but can be made from other III-V semiconductor materials. Stacks 116 and 126 can be doped or undoped and the doping can be n-type or p-type depending on the particular VCSEL design. In conventional VCSEL designs, the bottom mirror 116 may include about 30 to 35 mirror periods.

The active region 122 includes quantum wells 144 for stimulating the emission of laser energy. In the embodiment shown, the active region 122 may be less than 0.2 microns. The quantum wells 144 may also be referred to as the optical gain region. The quantum wells 144 are the locations where current through the active region causes the presence of injected carriers, holes and electrons, which cause a population inversion and optical gain. These electrons from the conduction band quantum well states combine with the holes in the valence band quantum well states (i.e. across the band gap) to cause the emission of photons 131. An aperture 146 may be provided through contact 113 to allow the emission of the photons 131.

In one embodiment, an aperture may also be provided near a conduction layer region above the quantum wells 144 for directing bias current to the central region of the VCSEL active region 122. In addition, added high Aluminum AlGaAs layers for electrical confinement can be placed close to the active region to enhance electrical confinement. InGaAs or GaAs layers can be used as the quantum wells. For 850 nm VCSELs the quantum well thickness for GaAs is around 80 A. For $In_{0.05}Ga_{0.95}As$ quantum wells the quantum well thickness is around 50 A. To compensate for the reduced gain distance, four quantum wells 144 may be used as opposed to three quantum wells 144.

Metal contact layers 112 and 113 can be ohmic contacts that allow appropriate electrical biasing of VCSEL 100. When VCSEL 100 is forward biased with a voltage on contact 113 different than the one on contact 112, active region 122 emits light 131 which passes through stack 126. Although the contact layers 112 and 113 in the example VCSEL 100 are located on the top and bottom surfaces of the VCSEL, in other embodiments, p-type and n-type intracavity or intramirror contacts may be used.

While various layers of the epitaxial structure have been described as being formed on other layers, this does not require that the layers be formed directly on the other layers. Rather, other intervening layers may exist between a layer and the layer in which that layer is formed. Various portions of the present discussion may refer to several configurations of the VCSEL.

As noted previously, DBR stacks typically include a plurality of mirror periods, where each mirror period includes a first layer of having a high index of refraction, a second layer of having a low index of refraction, and compositional ramps between each of the mirror layers. The thicknesses of each of the mirror layers in a conventional DBR stack are typically established such that the peaks and nulls of the optical field produced by a VCSEL occur within the compositional ramps. However, placing the peaks and nulls of the standing wave within the compositional ramps of the DBR stack may produce the unwanted consequence of at least partially negating many of the beneficial properties that are sought after when applying high doping concentrations to certain areas within the DBR stack. For instance, high doping concentrations are commonly applied to the compositional ramps within a DBR stack in order to improve conduction within the compositional ramps. However, as one of ordinary skill in the art will appreciate, a high doping concentration increases absorption, and particularly increases absorption in areas of high optical electric fields. Therefore, when the peak of a standing wave occurs within a compositional ramp, the doping in the compositional ramp is typically limited to no more than moderately heavy doping to avoid high levels of absorption within the compositional ramp.

The present invention achieves a conduction improvement by low or moderate heavily doping the ramps and extremely heavily doping near the nulls in high mobility material. Because the compositional ramps of the DBR stack have a lower carrier mobility than the mirror layers themselves, applying a high doping concentration within the compositional ramps yields a lower increase in lateral conduction then what could be obtained by applying the same high doping concentration within the highest mobility actual mirror layers. The present invention provides a solution that yields improved conduction with minimal increase in absorption.

Figure 2:
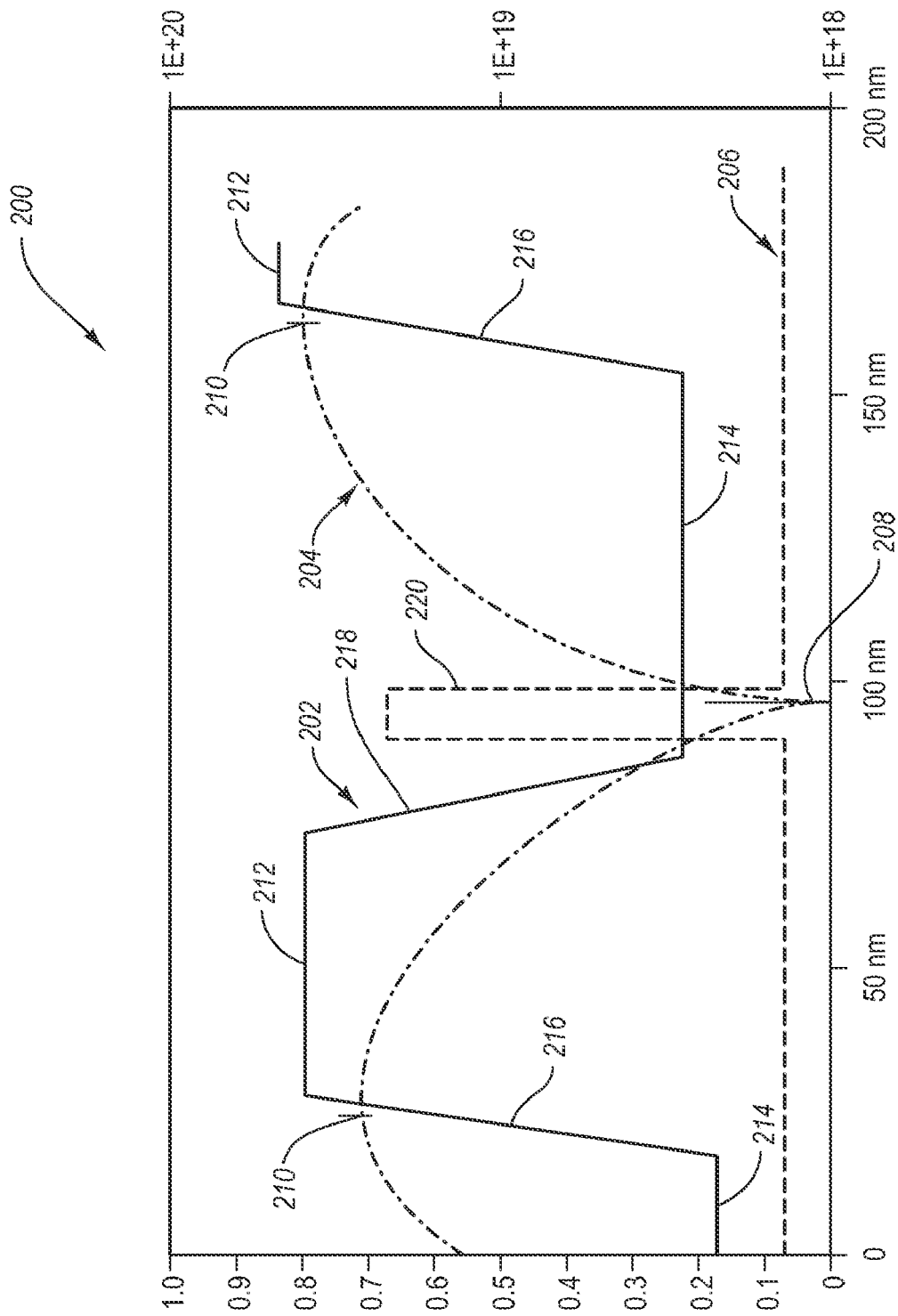
FIG. 2 illustrates one example plot depicting a relationship between the compositional makeup of a Distributed Bragg Reflector (DBR), a standing optical wave, and the doping levels within the DBR, where the nulls of the optical standing wave are located within a high mobility material.

FIG. 2 illustrates one example of a plot 200 depicting the relationship between the compositional makeup 202 (identified by a solid line) of a DBR stack, a standing optical wave 204 (identified by a dotted-dashed line), and a doping concentration 206 (identified by a dashed line) applied to the DBR stack. A scale is provided along the left-hand side of the plot 200 to describe the compositional makeup 202 of the DBR stack. The scale ranges from zero to one and represents the aluminum fraction in the alloy $Al_xGa_{1-x}As$, and where a low X value produces a high refractive index and a high X value produces a low refractive index. For example, an aluminum value of 0.1 signifies that the group III portion of the alloy is 10% Al, and 90% Ga. However, it will be appreciated that while AlGaAs is used in the present example, the principles described herein are not limited to any particular composition, but may instead be applied to all types of compositions.

A second scale is also provided along the right hand side of the plot 200 for providing context for the doping level 206. The second scale describes the acceptor concentration per centimeter cubed within the DBR stack. The depiction of the magnitude of the optical field 204 is provided without a reference scale, and is merely drawn to illustrate the relationship between the thicknesses of each mirror layer, the doping levels applied to the mirror periods, and the peaks 210 and nulls 208 of the optical wave 204 being reflected by the DBR mirror.

The embodiment illustrated in FIG. 2 provides a DBR stack having a plurality of mirror periods designed to reflect an optical field at a predetermined design wavelength of 850 nm (The index of refraction in this embodiment averages about 3.25). As stated previously, the magnitude of the optical field 204 includes peaks 210 and nulls 208. Each of the mirror periods described by the composition plot 212 includes a high mobility material 214, a low carrier mobility material 212, separated by first and second compositional ramps 218 and 216, respectively. As illustrated in the plot 200, the thicknesses of the first and second layers 214 and 212 are established such that the nulls 208 of the optical field 204 occur within the first layer 208 having higher carrier mobility, and not within the first compositional ramp 218, as is typically the case in conventional DBR stacks. Furthermore, as illustrated in the example plot 200, a high doping concentration 220 is applied to the first layer 214 at the location of the nulls 208 of the magnitude of the optical field 204.

Applying a high doping level 220 to a null 208 that has been offset from the compositional ramp 218 provides various benefits. For example, because the null 208 occurs within the high mobility material 214, the elevated doping level 220 provides a greater increase in conduction than would otherwise be obtained by applying a high doping level 220 to a compositional ramp 218 and/or 216 where the carrier mobility is typically lower. Therefore, enhanced lateral conduction from elevated doping is maximized. Furthermore, the high doping level 220 has a minimal absorption impact because the optical wave 204 is at its minimal absolute value 208 at the point of high doping. Furthermore, by heavily doping at the minimum absolute value 208 of the optical wave 204, a lower doping level can be used at other portions of the DBR structure, thereby more than offsetting the overall absorption impact within the DBR structure.

In the example embodiment illustrated in FIG. 2, the nulls 208 of the optical field 204 are positioned within the high mobility material 214 by making the higher mobility layer 214 thicker than the lower mobility layer 212, while retaining the overall optical thickness of each mirror period to be one-half wavelength of optical phase for the standing wave. The high carrier concentration 220 can be accomplished from additional doping, or in another embodiment, from modulation doping from the adjacent compositional ramp 218. In one embodiment, where modulation doping is used, the holes are transferred away from the dopant into adjacent material with a lower hole affinity. In the present embodiment, the holes are transferred at least partially from the high aluminum layer 212 and compositional ramp 218 to the low aluminum layer 214, where the null 208 is positioned.

In one embodiment, the DBR stack described in FIG. 2 may be used as one or more mirrors within a VCSEL device. For example, and referring again to FIG. 1, the VCSEL 100 may include a first DBR stack 116 including mirror periods 143a, where the thicknesses of the mirror periods 141a and 142a for at least a portion of the mirror periods 143a are established such that the nulls 208 of the optical wave 204 occur within the first layer 214 and not within the compositional ramp 218. An active region 122 containing quantum wells 144 may be disposed on the first mirror 116. A second DBR stack 126 may be disposed on the active region 122. A second DBR stack 126 may also include mirror periods 143b having mirror layers 141b and 142b whose thicknesses are established such that the nulls 208 occur within one of the layers 141b or 142b having a high mobility material, and not within the compositional ramp (e.g., 218) separating the two mirror layers 141b and 142b.

Referring again to FIG. 2, as described previously, the thicknesses of each mirror period is typically one half wavelength of the optical field 204. The thicknesses of the mirror layers 212 and 214 may be established such that the null 208 of the optical field 204 occurs within a high mobility material, such as the layer 214.

Figure 3:
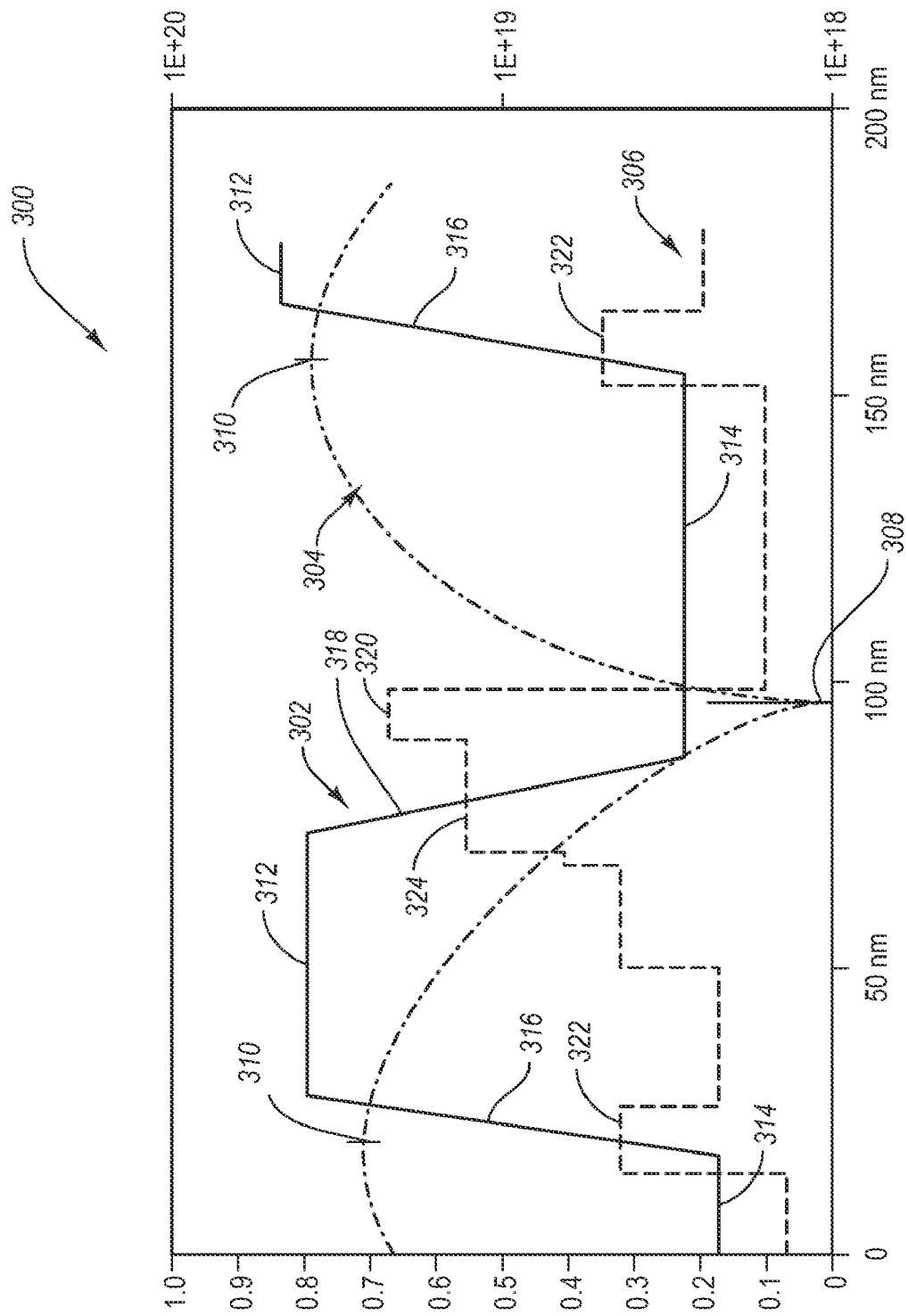
FIG. 3 illustrates an example plot depicting the relationship between the compositional makeup of a DBR, a standing optical wave occurring within a DBR, and the doping levels applied to each location within the DBR, where the nulls of the optical standing wave are located within a high mobility material.

Referring now to FIG. 3, a preferred embodiment is illustrated where the doping level, denoted at 310 includes moderate doping 322 and moderately heavy doping 324 in the compositional ramps 316 and 318, respectively, which is in contrast to the embodiment illustrated in FIG. 2. The doping 322 and 324 can be needed because of the changes in hole or electron affinity going through the ramps. The level and profile of doping at doping levels, 322 and 324 can be selected to minimize vertical resistance and absorption. The different levels of doping can be achieved in any number of steps and/or doping ramps. In one embodiment, the doping level 324 in the ramp 318 adjacent to null 308 is substantially higher than the doping level 322 in ramp 316. Doping 324 in compositional ramp 318 provides additional carriers to modulation dope the high mobility region around the null.

In addition to the moderate or moderately heavy doping of the compositional ramps, the device illustrated in FIG. 3 also includes a spike or high level of doping 320 (relative to ramp 318) in the high mobility region 314 near null 308. The maximum level of doping 320 occurs near null 308 and in the high mobility region 314 to minimize absorption while improving lateral conduction. The amount of dopant used to form the spike can depend on the type of dopant, p-type or n-type. In one embodiment of the invention, the doping spike near the null in the high mobility layer is a p-type dopant with a maximum doping level in a range from about $7e18/cm^3$ to about $5e20/cm^3$, more preferably in a range from about $1e19/cm^3$ to about $6e19/cm^3$, and most preferably in a range from about $2e19/cm^3$ to about $5e19/cm^3$. In an alternative embodiment, the doping spike near the null in the high mobility layer is an n-type dopant with a maximum doping level in a range from about $3e18/cm^3$ to about $9e18/cm^3$, more preferably in a range from about $4e18/cm^3$ to about $8e18/cm^3$, and most preferably in a range from about $5e18/cm^3$ to about $7e18/cm^3$.

In one embodiment, the doping spike is placed in a III-V semiconductor material that includes aluminum. The doping spike preferably occurs in a high mobility material. In one embodiment, the doping spike occurs in a III-V semiconductor material with an aluminum fraction in a range from about 0% to about 20%, more preferably in a range from about 12% to about 20%.

In one embodiment, and referring again to FIG. 2, the nulls 208 of the optical field 204 may be offset from the first compositional ramp 218 for only a portion of the overall thickness of the DBR stack. For example, in one embodiment, the thicknesses of the first and second mirror layers 214 and 212 are established such that the nulls 208 occur within the first layers of high mobility 214 for a portion of the mirror periods that are nearest to the active region 122 (FIG. 1), but occur within the first compositional ramps 218 for the mirror periods that are further away from the active region 122. In one embodiment, the thicknesses of the mirror layers may gradually change between the mirror periods that are nearest to the active region 122 and the mirror periods that are further away from the active region, such that the nulls 208 of the optical wave 204 gradually change from occurring at a location slightly offset from the second compositional ramp 218 for the mirror periods closest to the active region to occurring at a location within the second compositional ramp 218 for mirror periods furthest away from the active region.

The optical devices portrayed in FIGS. 2 and 3 may also be a part of a VCSEL. In other words, a VCSEL may include a first DBR stack having mirror periods with mirror layers having the thicknesses described in FIG. 3, where the peaks 310 of the optical field 304 occur within one of the layers 314 and/or 312, and not within the compositional ramp 316 or 318. An active region containing quantum wells may be disposed on the first DBR stack, and a second mirror incorporating the features of the invention may be disposed on the active region.

Although the thicknesses of each individual mirror layer 312 and 314 combined with the individual ramps may depart from the conventional quarter wavelength thickness, the overall thickness of an entire mirror period, which includes the two mirror layers 312 and 314 and the two compositional ramps 316 and 318 is nominally one half wavelength of the optical standing wave field. The thicknesses of the mirror layers 312 and 314 may be established such that the nulls 308 of the optical standing wave field 304 slightly offset from the second compositional ramp 318. Generally this is accomplished using less than a quarter wave thickness for 312 combined with a ramp, and more than a quarter wave thickness for 314 combined with a ramp. This by itself moves both the peaks and nulls towards or into layer 314. The position of the peaks and nulls relative to the layers can thus be adjusted, but it is also dependent on the surrounding structure, so that these positions can be adjusted somewhat by the design of other portions of the structure such as other mirror sections or the active region and spacers. In general, the reflectance of a mirror can be maximized and the absorption minimized using a thin film simulation program which takes into account absorption. Close to the active regions, the high doping spikes 320 should be at nulls and in high mobility layers. The optical field peak at 310 is occurring in the ramp 316 because other portions of the structure have shifted it slightly. In another embodiment, peak 310 can be in layer 312 by using a different external structure to push the null further into 314. As mentioned above, the peak 310 can also be in layer 314 by using yet another slightly different external structure.

Figure 4:
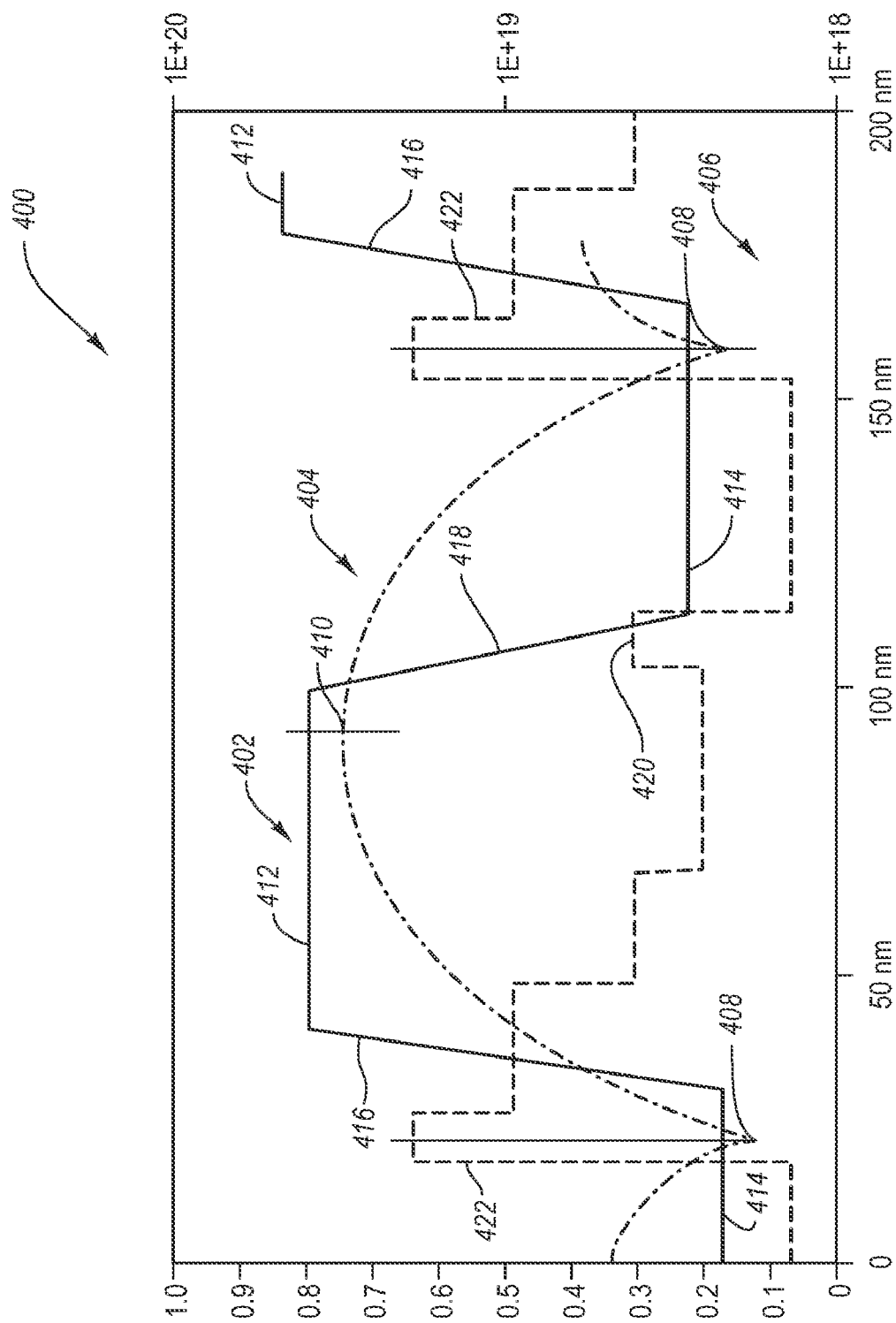
FIG. 4 illustrates another example plot depicting the relationship between the compositional makeup of a DBR, a standing optical wave, and the doping levels within the DBR, where the peak of the standing optical wave is offset from the compositional ramps between the layers of the DBR.

Another embodiment is illustrated in FIG. 4, which depicts another relationship between the compositional makeup 402 of a DBR stack, an optical field 404 reflected by the DBR stack, and doping levels 406 produced within the DBR stack. Primarily the design of the surrounding structures, and secondarily the thicknesses of the mirror layers 412 and 414 are established first, such that the nulls 408 of the optical field 404 occur within one of the high mobility materials 414 and not within the compositional ramps 416 and 410, and second, such that the peaks 410 of the optical field 404 occur within the layers 412, and not within the compositional ramps 416 and 418. Furthermore, an elevated doping concentration 422 is applied at the position of the nulls 408 of the optical field 404, for reasons described previously. Additionally, elevated doping concentrations 420 are applied within the compositional ramps 418 that are next to the location of the peaks 410 of the optical field 404. The embodiment illustrated in FIG. 4 may also include many of the other features described in reference of FIGS. 2-3, including being a part of a VCSEL structure, wherein two of the DBRs' described in FIG. 4 sandwich an active region.

Figure 5:
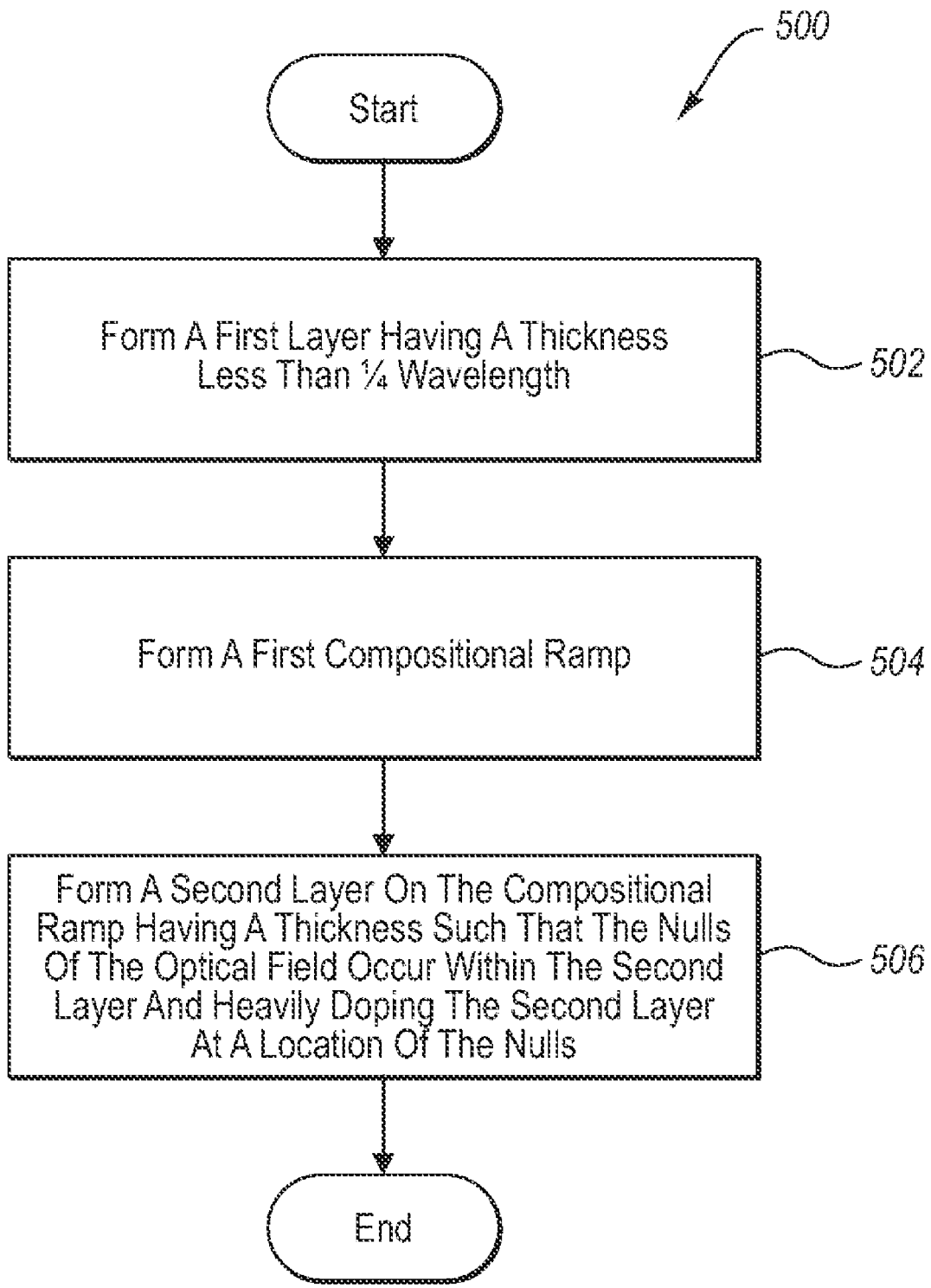
FIG. 5 illustrates an example method for fabricating an optical device according to the present invention.

Referring now to FIG. 5, a method 500 of fabricating a VCSEL is illustrated for fabricating an optical device. The steps of method 500 can be used to form a plurality of mirror periods designed to reflect an optical field at a predetermined wavelength, where the optical field has the peaks and nulls described in FIGS. 2-4. Forming the plurality of mirror periods includes, at 502, forming a first layer having a thickness of less than one quarter wavelength of the optical field. The method 500 further includes, at 504, forming a first compositional ramp on the first layer.

At 506, the method 500 further includes forming a second layer on the compositional ramp, where the second layer has a different index of refraction then the first layer. The second layer also has a higher carrier mobility than the first compositional ramp, as well as having a thickness such that the nulls of the optical field occur within the second layer, and not within the compositional ramp. Forming the second layer, at 506, further includes heavily doping the second layer at the location of the nulls of the optical field.

The method 500 may be employed for fabricating a VCSEL device. For example, a first DBR stack may be formed containing a plurality of mirror periods, where each mirrors period is constructed using the method 500. An active region may be formed upon the first DBR stack, and a second DBR stack may be formed on the active region, where the second DBR stack contains mirror periods formed using the method 500.

The present invention may be embodied in n or p type mirrors, with its utility being greater in p type mirrors The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An optical device comprising:
   an active region configured to emit an optical field;
   a first mirror comprising a first plurality of mirror periods designed to reflect an optical field at a design wavelength, at least a portion of the first mirror periods comprising,
   a first layer comprising a material with a relatively low carrier mobility;
   a second layer comprising a material having a higher carrier mobility than the first layer;
   a first compositional ramp between the first and second layers,
   wherein the optical thicknesses of the first and second layers is asymmetric and the relative mirror layer thicknesses are chosen such that a null of the optical field occurs within the second layer and not within the first compositional ramp; and
   an elevated doping level in the second layer near the null of the optical field.

2. An optical device as in claim 1, wherein the elevated doping level near the null is a p-type dopant with a maximum doping concentration in a range from about $7e18/cm^3$ to about $5e20/cm^3$.

3. An optical device as in claim 1, wherein the elevated doping level near the null is a p-type dopant with a maximum doping concentration in a range from about $1e19/cm^3$ to about $6e19/cm^3$.

4. An optical device as in claim 1, wherein the elevated doping level near the null is a p-type dopant with a maximum doping concentration in a range from about $2e19/cm^3$ to about $5e19/cm^3$.

5. An optical device as in claim 1, wherein the elevated doping level near the null is an n-type dopant with a maximum doping concentration in a range from about $3e18/cm^3$ to about $9e18/cm^3$.

6. An optical device as in claim 1, wherein the elevated doping level near the null is an n-type dopant with a maximum doping concentration in a range from about $4e18/cm^3$ to about $8e18/cm^3$.

7. An optical device as in claim 1, wherein the elevated doping level near the null is an n-type dopant with a maximum doping concentration in a range from about $5e18/cm^3$ to about $7e18/cm^3$.

8. An optical device as in claim 1, wherein within the plurality of mirror periods, the doping has a maximum concentration at the null of the optical field.

9. An optical device as in claim 1, wherein the first and second layers are made from a III-V semiconductor material comprising aluminum and the compositional ramp comprises a decrease or increase in the aluminum fraction of the type III material.

10. An optical device as in claim 1, wherein the elevated doping level near the null occurs in a III-V material with an aluminum content in a range from about 0% to about 20%.

11. An optical device as in claim 1, wherein the elevated doping level near the null occurs in a III-V semiconductor material with an aluminum content in a range from about 1.0% to about 20%.

12. The optical device as recited in claim 1, wherein the optical device is a VCSEL, the optical device further comprising:
a second mirror disposed on a side of the active region opposite the first mirror, the second mirror comprising a first plurality of mirror periods designed to reflect an optical field at a design wavelength, at least a portion of the first mirror periods comprising,
a first layer comprising a material with a relatively low carrier mobility;
a second layer comprising a material having a higher carrier mobility than the first layer;
a first compositional ramp between the first and second layers,
wherein the thicknesses of the first and second layers is asymmetric and the mirror periods are positioned within the optical field such that a null of the optical field occurs within the second layer and not within the first compositional ramp; and
an elevated doping level in the second layer near the null of the optical field.

13. The optical device as recited in claim 1, wherein a thickness of each mirror period is one-half wavelength of the optical standing wave field.

14. The optical device as recited in claim 1, further comprising a second composition ramp between a second layer of a first mirror period and a first layer of a second mirror period, wherein the mirror periods have a thickness and are positioned within the optical field such that a peak of the optical field occurs within the second composition ramp.

15. The optical device recited in claim 14, wherein the second compositional ramp has an elevated doping concentration with a maximum concentration that is lower than the maximum concentration at the null of the optical field in the second layer.

16. The optical device as recited in claim 1, further comprising a second composition ramp between a second layer of a first mirror period and a first layer of a second mirror period, wherein the mirror periods have a thickness and are positioned within the optical field such that a peak of the optical field occurs outside the second composition ramp.

17. The optical device as recited in claim 1, wherein the first plurality of mirror periods are the mirror periods closest to the active region, the optical device further comprising a second plurality of mirror periods, wherein the second plurality of mirror periods includes first and second layers having a composition ramp therebetween and the second plurality of mirror periods have a thicknesses such that a null of the optical field occurs within the composition ramp of the second plurality of mirror periods.

18. A vertical cavity surface emitting laser (VCSEL), comprising:
a bottom mirror formed above a substrate
an active region formed above the bottom mirror, the active region being configured to emit an optical field;
a top mirror comprising a first plurality of mirror periods designed to reflect an optical field at a design wavelength, the first mirror comprising an AlGaAs material, wherein at least a portion of the top mirror periods comprises,
a first layer having a relatively low index of refraction;
a second layer having a relatively high index of refraction;
a first compositional ramp between the first and second layers, the first compositional ramp comprising a decrease in the aluminum content from the first layer to the second layer,
wherein the thicknesses of the first and second layers is asymmetric and the mirror periods are positioned within the optical field such that a null of the optical field occurs within the second layer and not within the first compositional ramp; and
an elevated doping level in the second layer near the null of the optical field.

19. The optical device as recited in claim 1, wherein the first layer is thinner than the second layer.

20. The optical device as recited in claim 1, wherein the first layer has an optical thickness lower than the second layer.

21. The optical device as recited in claim 1, wherein the first layers has a substantially constant Al concentration that is higher than a substantially constant Al concentration of the second layer.

22. The optical device as recited in claim 1, wherein the null of the optical field occurs within a segment of the second layer having a maximum elevated doping level.

23. The optical device as recited in claim 1, wherein the null of the optical field occurs within a segment of the second layer having a maximum elevated doping level and the second layer includes a segment having a lower doping level on each side of the segment with the maximum elevated doping level.

24. The VCSEL as recited in claim 18, wherein the first layer is thinner than the second layer.

* * * * *